(12) United States Patent
Malaibari et al.

(10) Patent No.: US 9,878,912 B2
(45) Date of Patent: Jan. 30, 2018

(54) METHOD FOR PREPARING MULTI-WALL CARBON NANOTUBES USING CHEMICAL VAPOR DEPOSITION WITH AN ATOMIZATION SYSTEM

(71) Applicant: King Fahd University of Petroleum and Minerals, Dhahran (SA)

(72) Inventors: Zuhair Omar Malaibari, Dhahran (SA); Muataz Ali Atieh, Ar-Rayyan (QA); Fahad Ali Rabbani, Lahore (PK)

(73) Assignee: King Fahd University of Petroleum and Minerals, Dhahran (SA)

( * ) Notice: Subject to any disclaimer, the term of this patent is extended or adjusted under 35 U.S.C. 154(b) by 373 days.

(21) Appl. No.: 14/877,644

(22) Filed: Oct. 7, 2015

(65) Prior Publication Data
US 2017/0101317 A1    Apr. 13, 2017

(51) Int. Cl.
*C01B 31/02* (2006.01)
*C23C 16/452* (2006.01)
*C23C 16/44* (2006.01)

(52) U.S. Cl.
CPC ...... *C01B 31/0226* (2013.01); *C23C 16/4418* (2013.01); *C23C 16/452* (2013.01); *C01B 2202/06* (2013.01)

(58) Field of Classification Search
CPC ............ C01B 31/0226; C01B 2202/06; C23C 16/4418; C23C 16/452
See application file for complete search history.

(56) References Cited

U.S. PATENT DOCUMENTS

| 6,878,360 B1* | 4/2005 | Ohsaki ................ | B82Y 30/00 239/418 |
|---|---|---|---|
| 2012/0238021 A1 | 9/2012 | Hashim et al. | |

OTHER PUBLICATIONS

Venugopalan, et al., "The development and characterisation of carbon nanotubes grown on conductive substrate for field emission application", AIP Proceedings, Jun. 20, 2013, http://scitation.aip.org/content/aip/proceeding/aipcp/10.1063/1.4810052.

* cited by examiner

*Primary Examiner* — Daniel C McCracken
(74) *Attorney, Agent, or Firm* — Oblon, McClelland, Maier & Neustadt, L.L.P.

(57) ABSTRACT

A method for preparing multi-wall carbon nanotubes comprising atomizing a precursor solution comprising an aromatic hydrocarbon and a carrier gas. The mixture is then injected through an ultrasonic atomization system to form atomized precursor droplets. Then by injecting the atomized precursor droplets from the top of a vertical chemical vapor deposition reactor, the droplets can then react with a reaction gas in the reactor vessel to form a film that adsorbs to a growth surface in the reactor vessel. Layer by layer multi-wall carbon nanotubes are formed. This method is repeated to form layers of the multi-wall carbon nanotubes. The nanotubes formed have an outer diameter of 10 nm-51 nm and a length to diameter aspect ratio of 7200-13200.

20 Claims, 14 Drawing Sheets

METHOD FOR PREPARING MULTI-WALL CARBON NANOTUBES USING CHEMICAL VAPOR DEPOSITION WITH AN ATOMIZATION SYSTEM

BACKGROUND OF THE INVENTION

Technical Field

The present invention relates to a method for synthesizing multi-wall carbon nanotubes utilizing atomization in an injection vertical chemical vapor deposition reactor.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

In the last decade, extensive studies have been conducted on the synthesis of carbon nanotubes (CNT). Different paths of formation and precursors result in a variety of carbon nanomaterials of numerous shapes and sizes. See N. M. Mubarak, E. C. Abdullah, N. S. Jayakumar, and J. N. Sahu, "An overview on methods for the production of carbon nanotubes," J. Ind. Eng. Chem., vol. 20, no. 4, pp. 1186-1197, July 2014; and H. Golnabi, "Carbon nanotube research developments in terms of published papers and patents, synthesis and production," Sci. Iran., vol. 19, no. 6, pp. 2012-2022, December 2012, each incorporated herein by reference in their entirety.

By tuning reaction specifications, one can produce single wall or multi-wall CNT. CNT can be produced in large quantity by three basic methods: arc discharge, laser ablation and chemical vapor deposition (CVD) methods. See A. Shaikjee and N. J. Coville, "The role of the hydrocarbon source on the growth of carbon materials," Carbon N.Y., vol. 50, no. 10, pp. 3376-3398, August 2012, incorporated herein by reference in its entirety. Among these three, modifications of CVD reactors have led to flexible and economical methods and these properties make CVD reactors an exceptional choice for, not only research purposes, but also for commercial applications with large scale reactors. See M. Paradise and T. Goswami, "Carbon nanotubes—Production and industrial applications," Mater. Des., vol. 28, no. 5, pp. 1477-1489, January 2007; P. M. Ajayan, "Nanotubes from Carbon," Chem. Rev., vol. 99, no. 7, pp. 1787-1800, July 1999; and A. Mamalis, L. O. Vogtländer, and A. Markopoulos, "Nanotechnology and nanostructured materials: trends in carbon nanotubes," Precis. Eng., vol. 28, no. 1, pp. 16-30, January 2004, each incorporated herein by reference in their entirety.

A typical CVD reactor consists of two main parts in a horizontal assembly: a preheating zone and a reaction zone. A feed precursor, in solution form, enters from the preheating zone along with reaction gas and after vaporization; carrier gas takes the vapors to reaction zone, where reaction occurs. See R. Andrews, D. Jacques, A. M. Rao, F. Derbyshire, D. Qian, X. Fan, E. C. Dickey, and J. Chen, "Continuous production of aligned carbon nanotubes: a step closer to commercial realization," Chem. Phys. Lett., vol. 303, no. 5-6, pp. 467-474, April 1999; Y. Cheol-jin, Lee; Jae-eun, "Mass synthesis method of high purity carbon nanotubes vertically aligned over large-size substrate using thermal chemical vapor deposition," U.S. Pat. No. 6,350,488 B1, 2002; A. Cao, L. Ci, G. Wu, B. Wei, C. Xu, J. Liang, and D. Wu, "An effective way to lower catalyst content in well-aligned carbon nanotube films," Carbon N.Y., vol. 39, no. 1, pp. 152-155, January 2001; S. Huang, "Substrate-supported aligned carbon nanotube films," U.S. Pat. No. 7,799,163 B1, 2010; and R. Andrews, D. Jacques, D. Qian, and T. Rantell, "Multiwall Carbon Nanotubes: Synthesis and Application," Acc. Chem. Res., vol. 35, no. 12, pp. 1008-1017, December 2002, each incorporated herein by reference in their entirety. Otherwise solid precursor is put in a boat, which is placed in the preheating zone and after the precursor is vaporized then the carrier gas takes it to the reaction zone. The reactor works as a batch reactor and normally is used for research purposes. See M. H. Rümmeli, A. Bachmatiuk, F. Börrnert, F. Schäffel, I. Ibrahim, K. Cendrowski, G. Simha-Martynkova, D. Plachá, E. Borowiak-Palen, G. Cuniberti, and B. Buchner, "Synthesis of carbon nanotubes with and without catalyst particles.," Nanoscale Res. Lett., vol. 6, no. 1, p. 303, January 2011; A. M. Cassell, J. a. Raymakers, J. Kong, and H. Dai, "Large Scale CVD Synthesis of Single-Walled Carbon Nanotubes," J. Phys. Chem. B, vol. 103, no. 31, pp. 6484-6492, August 1999; N. Lee and S. Kr, "Method of vertically aligning carbon nanotubes on substrates at low pressure using thermal chemical vapor deposition with DC bias," U.S. Pat. No. 6,673,392 B2, 2004; F. Danafar, a. Fakhru'l-Razi, M. A. M. Salleh, and D. R. A. Biak, "Fluidized bed catalytic chemical vapor deposition synthesis of carbon nanotubes—A review," Chem. Eng. J., vol. 155, no. 1-2, pp. 37-48, December 2009; and H. Hou, A. K. Schaper, F. Weller, and A. Greiner, "Carbon Nanotubes and Spheres Produced by Modified Ferrocene Pyrolysis," no. 24, pp. 3990-3994, 2002, each incorporated herein by reference in their entirety.

For solid-gas interactions, a vertical CVD reactor is used. Solid precursor is continuously fed from the upper region of the reactor, where, after preheating, it enters into the reaction zone. Carrier gas is introduced from bottom of the reactor to fluidize the solid precursor and the reaction gas provides a reduced environment to accelerate the reaction. CNT form in the reaction zone and due to its low density, the carrier gas takes unreacted fluidized solid precursor out from the top of the reactor. However, there are features like bed height, pressure drop, fluidization velocity, product purity, reaction time control that make this system difficult to handle and to operate. See D. Venegoni, P. Serp, R. Feurer, Y. Kihn, C. Vahlas, and P. Kalck, "Parametric study for the growth of carbon nanotubes by catalytic chemical vapor deposition in a fluidized bed reactor," Carbon N.Y., vol. 40, pp. 1799-1807, 2002; Q. Weizhong, L. Tang, W. Zhanwen, W. Fei, L. Zhifei, L. Guohua, and L. Yongdan, "Production of hydrogen and carbon nanotubes from methane decomposition in a two-stage fluidized bed reactor," Appl. Catal. A Gen., vol. 260, no. 2, pp. 223-228, April 2004; Y. Yen, M. Huang, and F. Lin, "Synthesize carbon nanotubes by a novel method using chemical vapor deposition-fluidized bed reactor from solid-stated polymers," Diam. Relat. Mater., vol. 17, no. 3, pp. 567-570, 2008; Q. Weizhong, W. Fei, W. Zhanwen, L. Tang, Y. Hao, L. Guohua, and X. Lan, "Production of Carbon Nanotubes in a Packed Bed and a Fluidized Bed," AIChE, vol. 49, no. 3, pp. 619-625, 2003; F. Wei, Q. Zhang, W. Qian, H. Yu, Y. Wang, G. Luo, G. Xu, and D. Wang, "The mass production of carbon nanotubes using a nano-agglomerate fluidized bed reactor: A multiscale space—time analysis," Powder Technol., vol. 183, pp. 10-20, 2008; Y. Hao, Z. Qunfeng, W. Fei, Q. Weizhong, and L. Guohua, "Agglomerated CNTs synthesized in a fluidized bed reactor: Agglomerate structure and formation mechanism," Carbon N.Y., vol. 41, pp. 2855-2863, 2003; C. Hsieh, Y. Lin, W. Chen, and J. Wei, "Parameter setting on growth of carbon nanotubes over transition metal/alumina catalysts in a fluidized bed reactor," Powder Technol., vol. 192, no. 1, pp. 16-22, 2009; Y. Wang, F. Wei, G. Luo, H. Yu, and G. Gu, "The large-scale production of carbon nanotubes in a nano-agglomerate fluidized-bed reactor," Chem. Phys. Lett., vol. 364, no. 5-6, pp. 568-572, October 2002, each incorporated herein by reference in their entirety.

Injection vertical CVD (IVCVD) for a liquid feed system is a modified process that has not been reported previously for CNT synthesis. The precursor solution is injected from top into the reactor by a new technique, an "ultrasonic atomization system." The ultrasonic atomization system increases the surface area of the precursor prior to entering the preheating zone. See A. H. Lefebvre, Atomization and Sprays p. 434, incorporated herein by reference in its entirety. Reaction gas along with carrier gas take feed droplets into the reaction zone where CNT forms. Exhaust gases leave from the bottom of the reactor. By using this technique the efficiency of the reactor is increased. Another advantage of using IVCVD reactor is that it operates at low pressure as no fluidization velocity is required to be maintained. See Q. Zhang, M.-Q. Zhao, J.-Q. Huang, Y. Liu, Y. Wang, W.-Z. Qian, and F. Wei, "Vertically aligned carbon nanotube arrays grown on a lamellar catalyst by fluidized bed catalytic chemical vapor deposition," Carbon N.Y., vol. 47, no. 11, pp. 2600-2610, September 2009, incorporated herein by reference in its entirety.

There are different types of atomizer nozzles that can be used combined with an ultrasonic generator, like: narrow spray, wide spray with or without extension, radial spray and extra-long atomizer nozzle. See "Ultrasonic Atomizer Spray Nozzle Technology." Available from Sonozap Corp of Farmingdale, N.Y., USA, incorporated herein by reference in its entirety.

Aromatic solvents like benzene, toluene, xylene, and phenol are usually used as a carbon source for multi wall CNTs synthesis. Organometallocenes are often used as a catalyst. See N. Koprinarov, M. Konstantinova, T. Ruskov, and I. Spirov, "Ferromagnetic Nanomaterials Obtained by Thermal Decomposition of Ferrocene in a Closed Chamber," Phys, vol. 34, pp. 17-32,2007, incorporated herein by reference in its entirety. Ferrocene is non carcinogenic and is preferred for large scale production of CNT over other organometalic compounds (such as nickelocene). See O. Smiljanic, B. L. Stansfield, J.-P. Dodelet, A. Serventi, and S. Désilets, "Gas-phase synthesis of SWNT by an atmospheric pressure plasma jet," Chem. Phys. Lett., vol. 356, no. 3-4, pp. 189-193, April 2002, incorporated herein by reference in its entirety.

In view of the forgoing the object of the present disclosure is to provide a method for preparing CNT using an ultrasonic atomization system and a vertical chemical vapor deposition reactor.

BRIEF SUMMARY OF THE INVENTION

According to a first aspect, the present disclosure relates to a method for preparing multi-wall carbon nanotubes, including (i) atomizing a precursor solution comprising an aromatic hydrocarbon and a carrier gas, wherein the precursor solution is injected through an ultrasonic atomization system to form ultrasonic atomized precursor droplets, (ii) injecting the ultrasonic atomized precursor droplets from the top of a vertical chemical vapor deposition reactor into a preheating zone, (iii) reacting a reaction gas with the ultrasonic atomized precursor droplets in the vertical chemical vapor deposition reactor to form a film precursor that adsorbs to a growth surface in the vertical chemical vapor deposition reactor to form a layer of multi-wall carbon nanotubes, and (iv) repeating the atomizing, the injecting of the ultrasonic atomized precursor molecule, and the reacting until one or more layers of the multi-wall carbon nanotubes are formed and then removing the multi-wall carbon nanotubes from the growth surface. The present method produces multi-wall carbon nanotubes which are characterized by an outer diameter of 10 nm-51 nm, a length to diameter aspect ratio of 7200-13200.

In one embodiment the method of the present disclosure provides a 70%-95% yield based on a 6%-10% conversion rate of the precursor solution.

In one embodiment the precursor solution further comprises an organometallic catalyst.

In one embodiment the organometallic catalyst is an organometallocene catalyst, and the organometallocene catalyst is present in an amount from 0.3-2.0 wt % relative to the total weight of the precursor solution.

In one embodiment the carrier gas is an inert gas.

In one embodiment the inert gas is argon.

In one embodiment the ultrasonic atomizing system comprises an ultrasonic generating unit and an atomizing nozzle.

In one embodiment the ultrasonic atomization system produces an ultrasonic frequency of 15 kHz-25 kHz.

In one embodiment the atomizing nozzle has a 0.1-0.2 cm aperture and radial spray angle of 125°-140°.

In one embodiment the precursor solution is injected through the atomizing nozzle with a flow rate of 80-110 mL/min.

In one embodiment the vertical chemical vapor deposition reactor has at least four sections: a preheating zone, a reaction zone, a cooling zone and a collector.

In one embodiment the reacting takes place in the reaction zone, which is heated by a furnace to a temperature of 750° C.-1100° C.

In one embodiment the atomizing comprises injecting the precursor solution at 75-105 mL/hour through the ultrasonic atomization system.

In one embodiment the atomizing forms ultrasonic atomized precursor droplets with a diameter of 0.9 µm-500 µm.

In one embodiment the reaction gas is comprised of a 5:1-3:2 ratio of reacting gas to carrier gas.

In one embodiment the reacting gas is a reducing gas.

In one embodiment the reducing gas is hydrogen gas.

In one embodiment, the reacting takes place in the reaction zone at a pressure less than 1.5 bar and a temperature of 750° C.-1100° C.

In one embodiment the vertical chemical vapor deposition reactor is a hot-wall reactor.

In one embodiment the growth surface is comprised of quartz.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
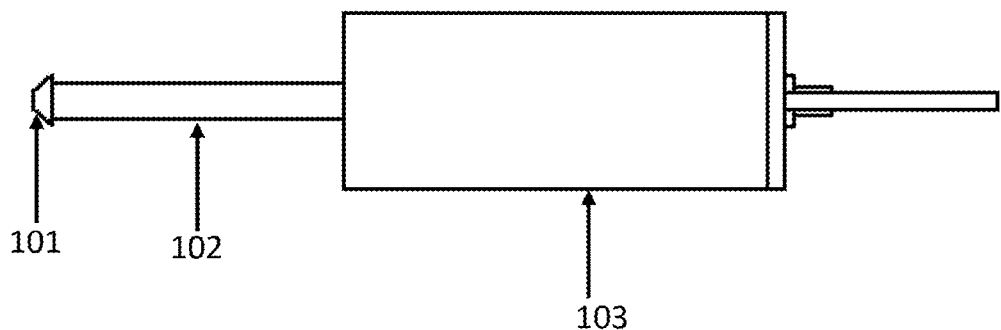
FIG. 1 is an exemplary schematic of an ultrasonic atomization system with an atomizing nozzle 101, nozzle stem 102, and an ultrasonic generating unit 103.

Referring now to the drawings, wherein like reference numerals designate identical or corresponding parts throughout the several views.

Figure 2:
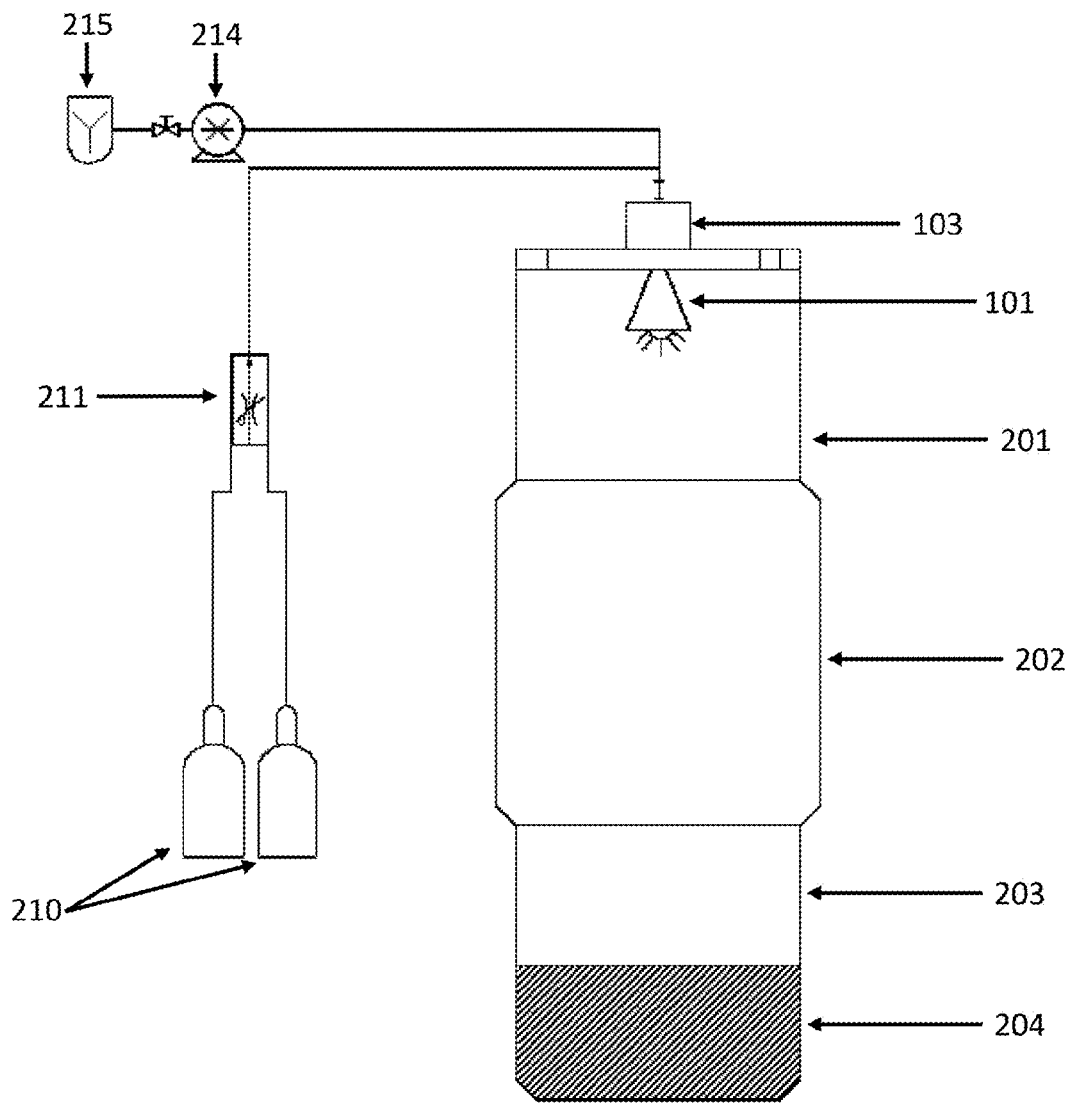
FIG. 2 is an exemplary schematic of an injection vertical chemical vapor deposition reactor.

According to a first aspect, the present disclosure relates to a method for preparing multi-wall carbon nanotubes, including atomizing a precursor solution comprising an aromatic hydrocarbon and a carrier gas in a vertical chemical vapor deposition reactor. The aromatic hydrocarbon can include, but is not limited to xylene, benzene, toluene, phenol, camphor and isomers thereof. Additionally, there can be mixtures of aromatic hydrocarbons to produce CNT. The carrier gas can include, but is not limited to argon, xenon, krypton, neon, or nitrogen. In one embodiment, argon is the preferred carrier gas. The carrier gas is intended to be inert to the chemical reactions taking place inside the vertical chemical vapor deposition reactor. The ratio of the volume of carrier gas to the volume of aromatic hydrocarbon can be at least 50:1, at least 40:1, at least 30:1, at least 20:1, at least 10:1. FIG. 2 depicts an exemplary reactor setup that includes an attachment for gas cylinders 210 that contain the carrier gas and a mixing and a regulator apparatus 211 that may be used to control the flow and volume ratio of the carrier and aromatic hydrocarbon gasses.

In one embodiment the precursor solution further comprises an organometallic catalyst. In one embodiment the organometallic catalyst is an organometallocene catalyst, and the organometallocene catalyst forms at least 0.1 wt % of the total weight of the precursor solution, at least 0.5 wt % of the total weight of the precursor solution, at least 0.75 wt % of the total weight of the precursor solution, at least 1.0 wt % of the total weight of the precursor solution, at least 0.5 wt % of the total weight of the precursor solution, at least 1.5 wt % of the total weight of the precursor solution, at least 2.0 wt % of the total weight of the precursor solution, at least 2.5 wt % of the total weight of the precursor solution, at least 3.0 wt % of the total weight of the precursor solution. Metallocenes are a type of sandwich compound, an organometallic complex featuring a metal bound by haptic covalent bonds to two arene ligands. A metallocene is a compound typically consisting of two substituted or unsubstituted cyclopentadienyl anions (Cp, which is $C_5H_5^-$) bound to a metal center (M) in the oxidation state II or IV, with the resulting general formula $(C_5H_5)_2M$ or $(C_5H_5)_2MX_2$, e.g., ferrocene, cobaltocene, and nickelocene. As referred to herein, the term "substituted" means that at least one hydrogen atom is replaced with a non-hydrogen group, provided that normal valencies are maintained and that the substitution results in a stable compound. Exemplary cp groups include, but are not limited to cyclopentadienyl, pentamethylcyclopentadienyl, and 1,2-diphenyl cyclopentadienyl. Further, the metallocene catalyst may refer to several classification types, including but not limited to parallel, multi-decker, half-sandwich, bent (tilted), and multi-cyclopentadienyl complexes. In one embodiment, inclusion of the catalyst in the precursor solution results in the catalyst becoming embedded within the multi-wall carbon nanotube product, which may advantageously provide structural support to the multi-wall carbon nanotubes. In addition to organometallocene catalysts, other categories of organometallic catalysts can be used in the present method, such as alkyl catalysts, aryl catalysts, phosphine catalysts, pthalocyanine catalysts and the like. The organometallic catalyst can include, but is not limited to iron pentacarbonyl, phenylsilver, chloro(cyclopentadienyl)bis(triphenylphosphine)ruthenium, triethylaluminium, and nickel pthalocyanine.

Figure 3:
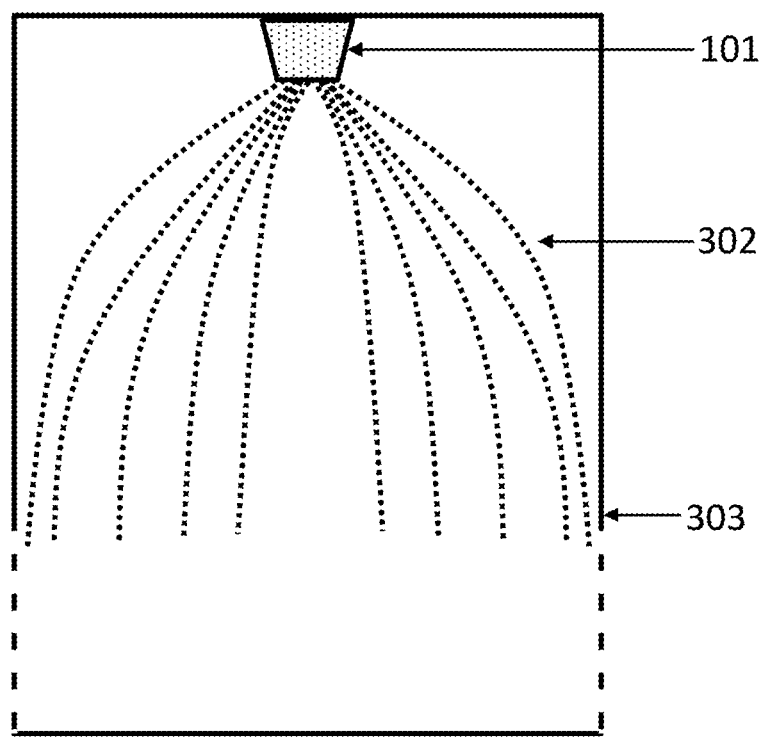
FIG. 3 is an exemplary velocity profile 302 of the spray from an atomizer nozzle 301.

The present method includes atomizing a precursor solution with the ultrasonic atomization unit. The ultrasonic atomization unit is placed directly before the preheating zone of the reactor. To atomize the precursor solution, the carrier gas is injected with the precursor solution through an ultrasonic atomization system (FIG. 1) to form ultrasonic atomized precursor droplets. In one embodiment, the precursor solution is injected into the ultrasonic atomization system at a flow rate of at least 60 mL/hour, at least 70 mL/hour, at least 80 mL/hour, at least 90 mL/hour, at least 100 mL/hour, at least 110 mL/hour, at least 120 mL/hour. As shown in FIG. 2, the precursor solution, held in a reservoir 215, can be injected by various pumps 214 including, but not limited to a diaphragm pump, a peristaltic pump, an impeller pump, a screw pump, and a piston pump. The pumps size is configured to the appropriate size of the reactor. Similarly, the flow rate of the solutions and gases can be increased for larger reactors. For example, doubling the size of the reactor would correspond to a doubling of the flow rate. FIG. 1 is a schematic of an exemplary ultrasonic atomization system with an atomizing nozzle 101, nozzle stem 102, and an ultrasonic generating unit 103. The ultrasonic generating unit comprises a mechanism to convert electrical energy into mechanical energy, often understood as the piezoelectric effect. In one embodiment the ultrasonic generating unit uses a piezoelectric crystal to generate ultrasonic waves that result in frequencies that generate atomized droplets of a solution. In one embodiment, the ultrasonic atomization unit has an operating frequency of at least 15 kHz, at least 20 kHz, at least 25 kHz, at least 30 kHz, at least 35 kHz. The power output of the ultrasonic atomization unit is at least 150 W, at least 100 W, at least 75 W, at least 50 W, at least 25 W, at least 10 W. Once the precursor solution is injected into the ultrasonic atomization system, the near-ultrasonic or ultrasonic frequency atomizes the solution into droplets with diameters of at least 0.5 μm, at least 1.0 μm, at least 10 μm, at least 20 μm, at least 25 μm, at least 50 μm, at least 75 μm, at least 100 μm, at least 200 μm, at least 300 μm, at least 400 μm, at least 500 μm. The ultrasonic atomized precursor droplets flow through the atomizing nozzle at a rate of at least 60 mL/min, at least 70 mL/min, at least 80 mL/min, at least 90 mL/min, at least 100 mL/min, at least 110 mL/min, and at least 120 mL/min. FIG. 3 depicts a schematic of the velocity profile of the ultrasonic atomized precursor droplets 302 as they are injected through the atomizing nozzle 101 into a preheating zone 201 of the vertical chemical vapor deposition reactor and against the walls of the reactor 303. In one embodiment the atomizing nozzle has at least a 0.05 cm diameter aperture, at least a 0.1 cm diameter aperture, at least a 0.15 cm diameter aperture, at least a 0.2 cm diameter aperture. The nozzle of the atomizer may also have multiple apertures of various sizes and shapes to produce different dispersive angles and variation in the velocity profile of the droplets as they leave the atomizer nozzle. The wide range atomizer nozzle produces widely dispersed droplets over a wider area than a narrow nozzle due to the angle portion of the tip. In one embodiment, the radial spray angle of the nozzle is between 120°-160°, between 125°-155°, between 130°-150°, between 135°-145°, between 135°-140°.

In one embodiment, the ultrasonic atomized precursor droplets are injected through the atomizing nozzle 101 from the top of a vertical chemical vapor deposition (VCVD) system (FIG. 2). The vertical chemical vapor deposition reactor has at least four sections: a preheating zone 201, a reaction zone 202, a cooling zone 203 and a collector 204. During the process of chemical vapor deposition the reaction zone is heated by a furnace to a temperature of at least 700° C., at least 750° C., at least 800° C., at least 850° C. at least 900° C., at least 950° C. at least 1000° C., at least 1050° C., at least 1100° C. In one embodiment, the reaction zone 202 is held at a constant temperature during the reacting. A constant temperature refers to a temperature that does not change by more than 5%, preferably 4%, preferably 3%, preferably 2%, more preferably 1%. During the reacting the reaction zone of the reactor vessel is held at a pressure less than 5.0 bar, less than 4.5 bar, less than 4.0 bar, less than 3.5 bar, less than 3.0 bar, less than 2.5 bar, less than 2.0 bar, less than 1.5 bar, and less than 1.0 bar. In one embodiment the reactor vessel is a hot-wall reactor.

After the ultrasonic atomized precursor droplets are injected into the reactor vessel a reaction gas is injected to react with the ultrasonic atomized precursor droplets. The reacting gas is also a reducing gas, which reduces the chemical environment of the reactor vessel. In one embodiment the reaction gas is comprised of preferably a 5:1 ratio of reacting gas to carrier gas, preferably a 9:2 ratio of reacting gas to carrier gas, preferably a 4:1 ratio of reacting gas to carrier gas, preferably a 7:2 ratio of reacting gas to carrier gas, preferably a 3:1 ratio of reacting gas to carrier gas, preferably a 5:2 ratio of reacting gas to carrier gas, preferably a 2:1 ratio of reacting gas to carrier gas. The reacting gas may include but is not limited to hydrogen gas, ammonia gas, hydrogen sulfide gas, or methane gas, but preferably hydrogen gas. The reacting gas of the reaction gas and the ultrasonic atomized precursor droplets react to form a film precursor that adsorbs to a growth surface in the reactor vessel to form a layer of multi-wall carbon nanotubes at least about 10 nm thick, at least about 7 nm thick, at least about 5 nm thick, at least about 2 nm thick, at least about 1 nm thick, at least 0.75 nm thick, at least about 0.5 nm thick, at least about 0.25 nm thick, at least about 0.1 nm thick. The growth surface can include, but is not limited to, the wall of the reactor vessel in the collecting zone 204 of the reactor vessel or a specific surface placed in the collecting zone of the reactor vessel. The composition of the growth surface can include, but is not limited to quartz, zeolite, silicon, germanium, aluminum oxide, and silicon carbide.

Repetitively and/or continuously atomizing the precursor solution, injecting the ultrasonic atomized precursor droplet and reacting with the reaction gas results in multi-wall carbon nanotubes (MWCNT) formed on the growth surface in the reactor vessel. In one embodiment, the present method produces MWCNT which are characterized by an outer diameter of at least approximately 1 nm up to approximately 100 nm, at least approximately 10 nm up to 90 nm, at least approximately 20 nm up to 80 nm, at least approximately 30 nm up to 90 nm, at least approximately 40 nm up to 60 nm. Furthermore, the MWCNT produced have a length to diameter aspect ratio of at least approximately 7000 up to approximately 13500, at least a length to diameter aspect ratio of approximately 7500 up to approximately 13000, at least a length to diameter aspect ratio of approximately 8000 up to approximately 12500, at least a length to diameter aspect ratio of approximately 8500 up to approximately 12000, at least a length to diameter aspect ratio of approximately 9000 up to approximately 11500, at least a length to diameter aspect ratio of approximately 9500 up to approximately 11000, at least a length to diameter aspect ratio of approximately 10000 up to approximately 10500 . The method of the present disclosure can provide at least a 60% up to a 98% yield, at least a 65% up to a 95% yield, at least a 70% up to a 90% yield, and at least a 75% up to a 85% yield based on at least a 1% to at least a 15% conversion rate of the precursor solution, at least a 3% to at least a 12% conversion rate of the precursor solution, at least a 5% to at least a 10% conversion rate of the precursor solution.

Figure 5A:
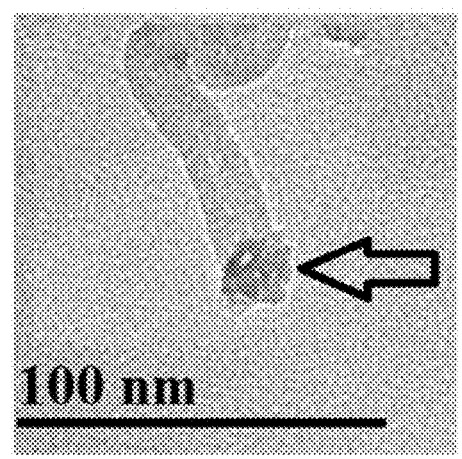
FIG. 5A is a transmission electron microscopy (TEM) image of a single multi-wall carbon nanotube shown with an arrow indicating its cross section.
Figure 5B:
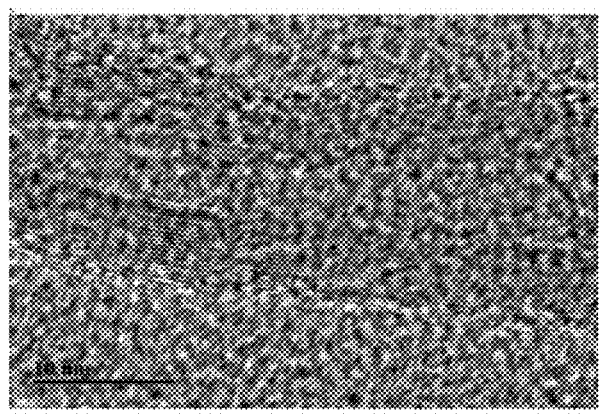
FIG. 5B is a TEM image of walls of multi-wall carbon nanotube are visible.
Figure 5C:
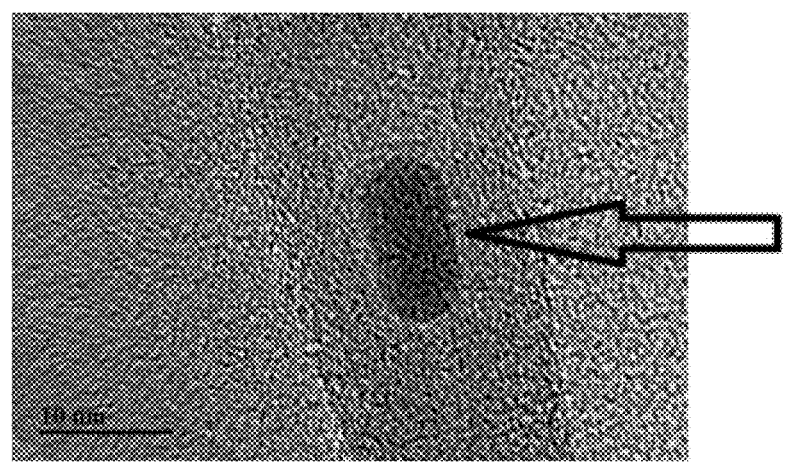
FIG. 5C is a TEM image of multi-wall carbon nanotube with its catalyst particle indicated by an arrow.
Figure 7A:
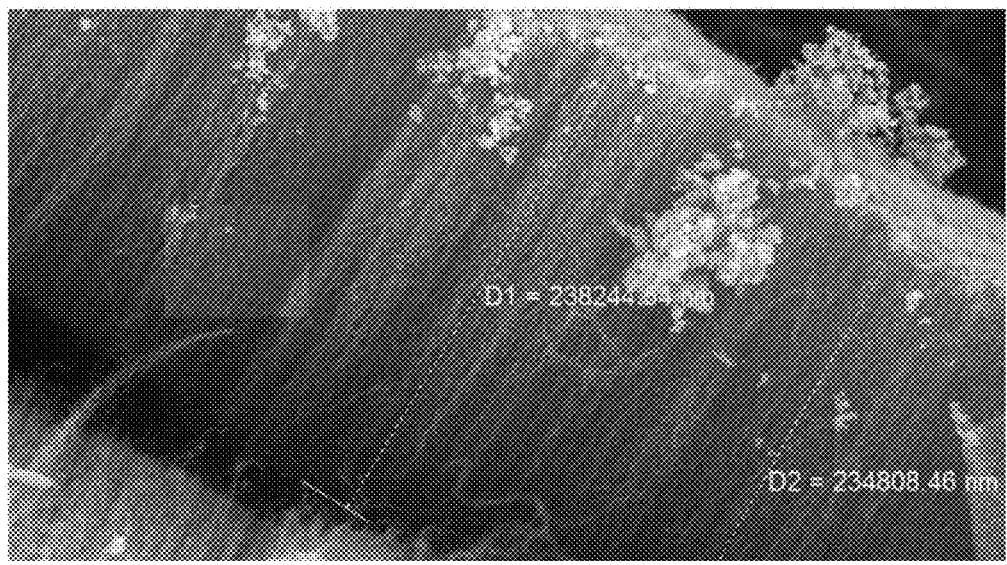
FIG. 7A is a SEM image of a high aspect ratio multi-wall carbon nanotube.
Figure 7B:
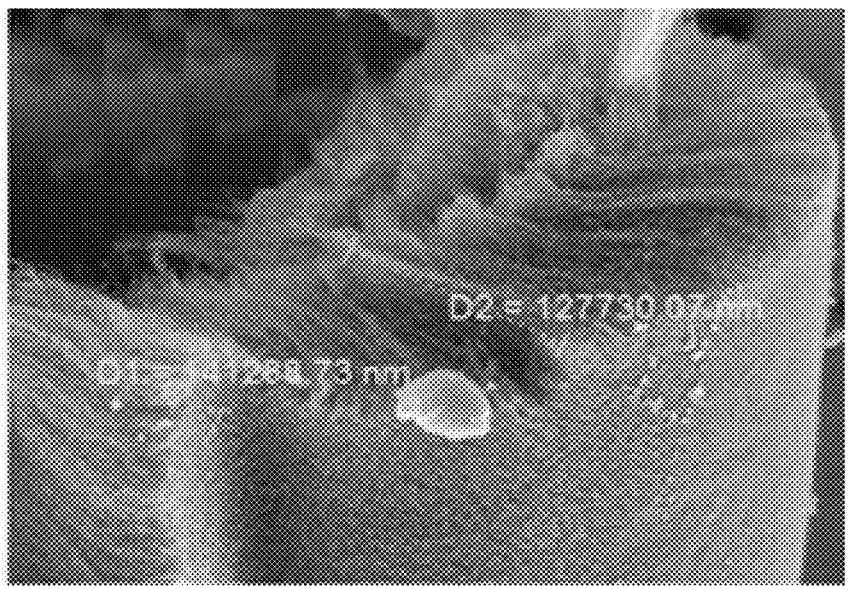
FIG. 7B is a SEM image of a second view of a high aspect ratio multi-wall carbon nanotube.
Figure 7C:
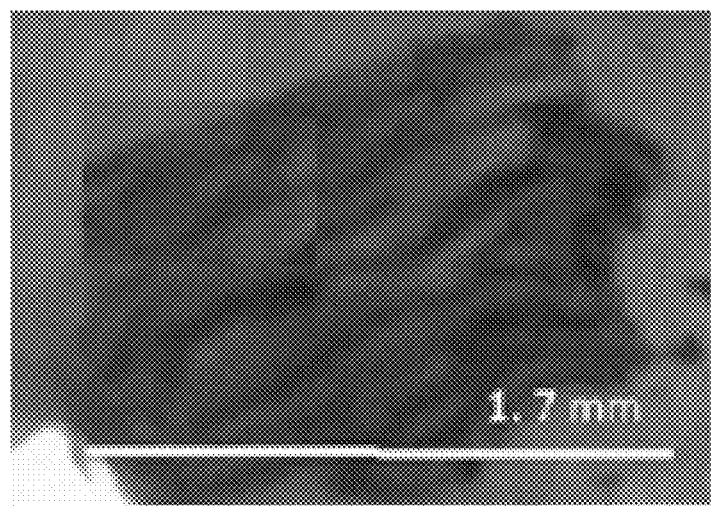
FIG. 7C is a SEM image of a large wafer of multi-wall carbon nanotube.

The MWCNT formed by this method may be in various structures such as parchment, Russian doll, and in layers. In the parchment form the MWCNT wraps around itself like a parchment, such that a view of its cross section would appear as a spiral. In the Russian doll structure, the multi-wall CNT forms as concentric cylinders of nanotubes. In rare cases the CNT may form into flat layers that can stack upon each other forming aligned wafers (FIG. 7C). CNT yield obtained by this method can be at least 75% aligned wafers, at least 65% aligned wafers, at least 55% aligned wafers, at least 45% aligned wafers, at least 35% aligned wafers, at least 25% aligned wafers, at least 15% aligned wafers, at least 5% aligned wafers. FIG. 5C shows a particle of ferrocene catalyst embedded in the center of a MWCNT. In one embodiment, the embedded catalyst provides a support to the growing MWCNT during the CVD process by increasing the tensile strength of the MWCNT. The tensile strength can be increased by as much as 20%, by as much as 15%, by as much as 10%, by as much as 5%, by as much as 2.5%, by as much as 1%. The various structural formations of CNT can also be directed by the embedded catalyst due to electronic interaction from the metal center of the catalyst with the carbon at the surface of the MWCNT. Additional functionalization is also possible due to the embedded catalysts.

The examples below are intended to further illustrate protocols for preparing multi-wall carbon nanotubes synthesis using the atomization system in chemical vapor deposition.

EXAMPLE 1

Experimental Method

Materials pXylene (96-99%) was purchased from Sigma-Aldrich Co. LLC. and was used without further purification. Ferrocene was purchased from Honeywell Riedel-de Haen International Inc. with 96-99% purity and was used without further purification. Ultrasonic atomization system was bought from Sonaer Inc. which has two parts: (i) ultrasonic generator which can produce frequency up to 20 kHz and (ii) wide spray atomizer nozzle that allows up to 100 ml/min fluid flow (FIG. 1).

Catalytic solution and the precursor were injected into the reactor using wide range ultrasonic atomizer nozzle fitted in the IVCVD reactor head. CNT diameter and aspect ratio is controlled by reaction temperature. See Q. Zhang, J.-Q. Huang, M.-Q. Zhao, W.-Z. Qian, and F. Wei, "Carbon nanotube mass production: principles and processes.," ChemSusChem, vol. 4, no. 7, pp. 864-89, July 2011, incorporated herein by reference in its entirety. By changing and repeating various reaction conditions advantageous reaction temperature was found to be 850° C. SEM, TEM and EDS were used to characterize the synthesize MWCNT.

Procedure:

The quartz wall vertical reactor and setup used for CNT synthesis is shown in FIG. 2. It has four main parts; preheating zone, reaction zone, cooling zone and collector. Feed solution enters from top of the reactor and passed through preheating zone to reaction zone, where (after various reactions) 90% of yield was observed. Cooling zone helps to cool down reactor temperature after completion of reaction. CNT is scrapped from quartz wall of the reactor and is collected from the collector.

The reactor was heated by an electric furnace until temperature reached to 850° C. and was held constant at this temperature. Argon (Ar) was purged into the reactor, from top, to remove any undesirable gas and was continuously injected to control the reaction time of CNT. pX was used as carbon source and FCN; as Fe source; for CNT synthesis. One weight percent catalytic solution (CS) of FCN in pX was prepared and injected into the atomizer nozzle via syringe pump at the flow rate of 90 ml/hr for half hour.

Ultrasonic atomization system was installed at the head of reactor which was operated at high frequency, 20 kHz, to obtain smallest droplet size. Atomizer nozzle was placed in a way that its leg; which is 2.18 cm, appeared in the quartz region of the reactor. CS passed through atomizer nozzle and spread in the reactor in an umbrella-shape profile (FIG. 3). This injection system increased the surface area of CS and made evenly distribution of CS particles. When the atomization of CS was observed in the quartz reactor, $H_2$; which acted like reaction gas (RG), was also injected from top of the reactor along with Ar in the ratio of 3:1 respectively.

Reaction took place in the reaction zone of the reactor and CNT deposition on the quartz wall was observed. Electric furnace was turned off after completion of reaction. RG was stopped and system was cooled in Argon atmosphere. CNT was scrapped from quarts walls of the reactor and was collected from collector.

Results and Discussion

Multi-wall carbon nanotubes were synthesized and characterized by using SEM, HRTEM, and EDS. After series of experiments optimum condition of maximum yield was found for proposed injected vertical chemical vapor deposition (IVCVD) reactor fitted with ultrasonic atomizing head system. The injected vertical CVD reactor has not been reported before and ultrasonic atomization system has also not been used previously for CNT synthesis. Feed stream and reaction gas direction is selected from top of IVCVD reactor in concurrent flow so that reaction time can be increased and to sweep synthesize CNT. Ar was used.

The synthesized MWCNT were collected from collector of the reactor and 7.43% conversion of catalytic solution was found. By using ultrasonic atomizer, the size of catalytic solution decreased to microns prior to entering into the pre-heating zone of the reactor. This scheme enhanced the surface area of catalytic solution resulting into high yield that has not been reported previously. The MWCNT synthesis efficiency was increased with the combination of IVCVD reactor and the ultrasonic atomizer.

Figure 4A:
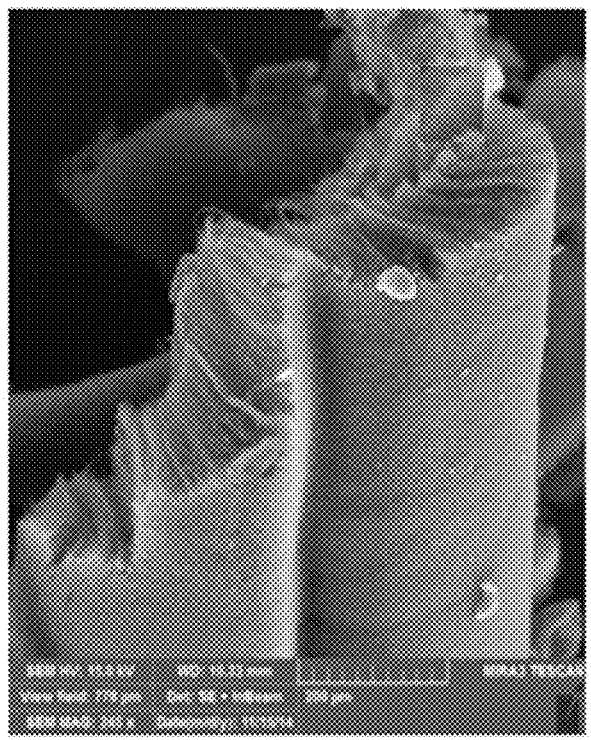
FIG. 4A is a scanning electron microscopy (SEM) image of multi walled multi-wall carbon nanotube 200 μm scale.
Figure 4B:
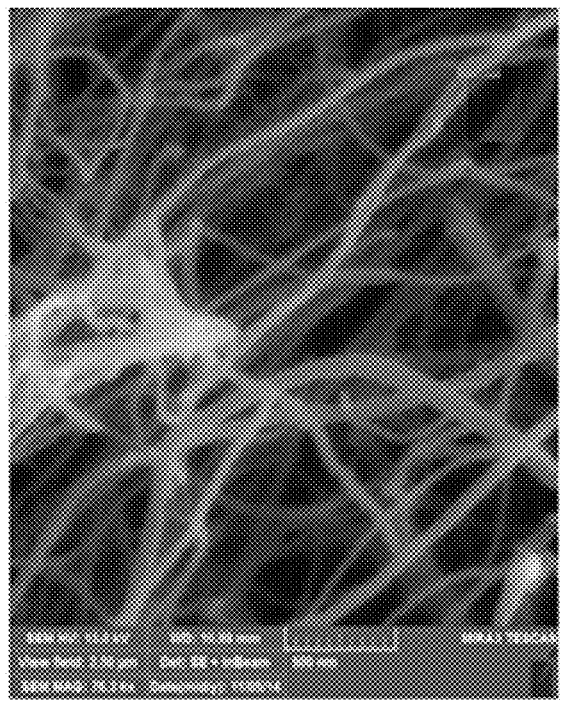
FIG. 4B is a SEM image of multi walled multi-wall carbon nanotube 500 nm scale.

SEM images of a sample showed vertically aligned MWCNT (FIG. 4A) and further investigation of the sample showed the CNT were straight and separated from each other (FIG. 4B). This behavior indicates that CNT have high surface area.

Transmission electron microscope was used to investigate the placement of catalyst, structure of CNT and shape of catalyst. FIG. 5A showed tip growth mechanism for CNT structure formation, multi walls can be seen inside a tube in FIG. 5B, whereas catalyst particle is clear in FIG. 5C on which different layers of carbon are surrounding to make multi walls.

Figure 6A:
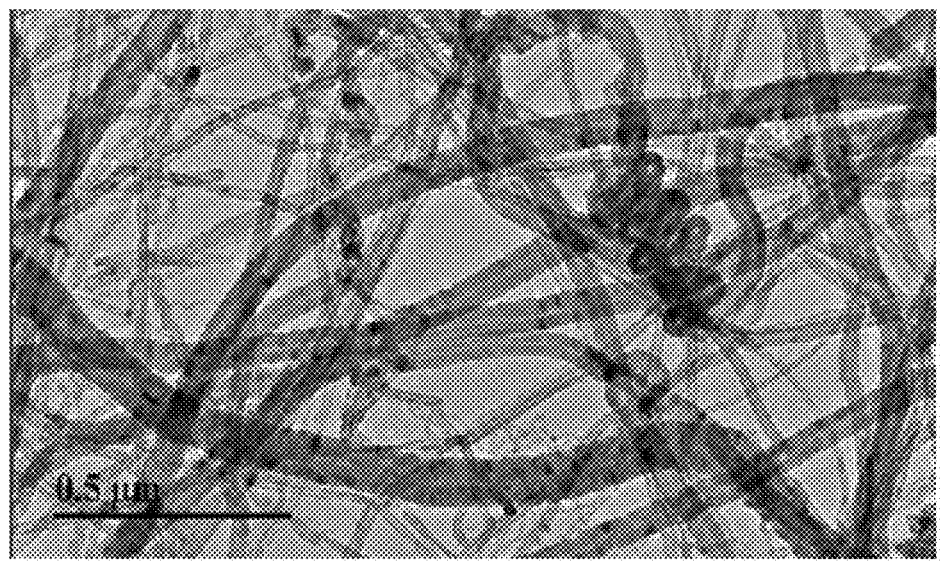
FIG. 6A is an image if the region used for energy-dispersive X-Ray spectroscopy (EDS).
Figure 6B:
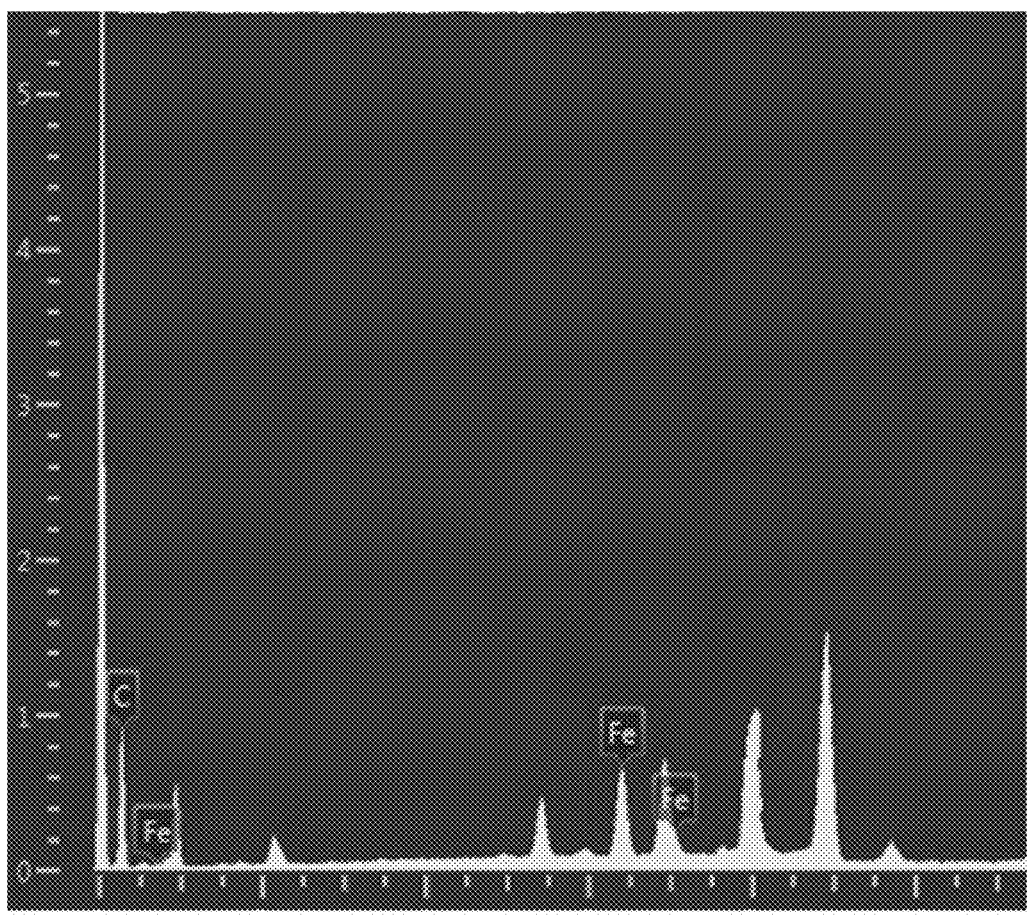
FIG. 6B is an EDS characterization for sampled area shown in FIG. 6A.
Figure 6C:
FIG. 6C is a table describing the EDS characterization in FIG. 6B, for sampled area shown in FIG. 6A.

FIG. 6B-6C are details of energy-dispersive X-ray spectroscopy (EDS) of sample area shown in FIG. 6A. Outer diameter of CNT varied between 15 nm to 39 nm. High aspect ratio (l/d) achieved from synthesized CNT ranging from 8,000-12,000 (FIG. 7A and FIG. 7B).

The crystallization and alignment of CNT increased when $H_2$ concentration was increased during the reaction. In the absence of Ar and total reducing environment of $H_2$; large filament of CNT produced which showed very high aspect ratio (FIG. 7B). The aligned and wafer form of CNT is formed due to layer by layer coverage of CNT bundles on each other, as shown in FIGS. 7A-7C. This is a very rare phenomenon in CVD reactor but by using wide range atomization nozzle in ultrasound atomization system we successfully produced various run of wafer form CNT. A wide range atomizer nozzle has not been reported previously for CNT production.

The invention claimed is:

1. A method for preparing multi-wall carbon nanotubes, comprising:
    atomizing a precursor solution comprising an aromatic hydrocarbon and a carrier gas, wherein the precursor solution is injected through an ultrasonic atomization system to form ultrasonic atomized precursor droplets;
    injecting the ultrasonic atomized precursor droplets from the top of a vertical chemical vapor deposition reactor into a preheating zone;
    reacting a reaction gas with the ultrasonic atomized precursor droplets in the vertical chemical vapor deposition reactor to form a film precursor that adsorbs to a growth surface in the vertical chemical vapor deposition reactor to form a layer of multi-wall carbon nanotubes; and
    repeating the atomizing, the injecting of the ultrasonic atomized precursor molecule, and the reacting until one or more layers of the multi-wall carbon nanotubes are formed and then removing the multi-wall carbon nanotubes from the growth surface;
    wherein the multi-wall carbon nanotubes have an outer diameter of 10 nm-51 nm, a length to diameter aspect ratio of 7200-13200.

2. The method of claim 1, wherein the precursor solution further comprises an organometallic catalyst.

3. The method of claim 2, wherein the organometallic catalyst is an organometallocene catalyst, and the organometallocene catalyst is present in an amount from 0.3-2.0 wt % relative to the total weight of the precursor solution.

4. The method of claim 1, wherein the carrier gas is a inert gas.

5. The method of claim 4, wherein the inert gas is argon.

6. The method of claim 1, wherein the ultrasonic atomizing system comprises an ultrasonic generating unit and an atomizing nozzle.

7. The method of claim 6, wherein the ultrasonic atomization system produces an ultrasonic frequency of 15 kHz-25 kHz.

8. The method of claim 6, wherein the atomizing nozzle has a 0.1-0.2 cm aperture and a radial spray angle of 125°-140°.

9. The method of claim 6, wherein the precursor solution is injected through the atomizing nozzle with a flow rate of 80-110 mL/min.

10. The method of claim 1, wherein the vertical chemical vapor deposition reactor has at least four sections: the preheating zone, a reaction zone, a cooling zone and a collector.

11. The method of claim 10, wherein the reacting takes place in the reaction zone, which is heated by a furnace to a temperature of 750° C.-1100° C.

12. The method of claim 1, wherein the atomizing comprises injecting the precursor solution at 75-105 mL/hour through the ultrasonic atomization system.

13. The method of claim 1, wherein the atomizing forms ultrasonic atomized precursor droplets with a diameter of 0.9 μm-500 μm.

14. The method of claim 1, wherein the reaction gas is comprised of a 5:1-3:2 ratio of reacting gas to carrier gas.

15. The method of claim 14, wherein the reacting gas is a reducing gas.

16. The method of claim 15, wherein the reducing gas is hydrogen gas.

17. The method of claim 1, wherein the reacting takes place at a pressure less than 1.5 bar and a constant temperature.

18. The method of claim 1, wherein the vertical chemical vapor deposition reactor is a hot-wall reactor.

19. The method of claim 1, wherein the growth surface is comprised of quartz.

20. The method of claim 1, wherein the multi-wall carbon nanotubes are formed in 70%-95% yield based on a 6%-10% conversion rate of the precursor solution.

* * * * *